(12) United States Patent
Shin et al.

(10) Patent No.: US 9,171,956 B2
(45) Date of Patent: Oct. 27, 2015

(54) THIN FILM TRANSISTOR AND DISPLAY DEVICE USING THE SAME

(75) Inventors: Jae-Min Shin, Yongin (KR); Ji-Yong Park, Yongin (KR); Kyung-Min Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 855 days.

(21) Appl. No.: 13/072,625

(22) Filed: Mar. 25, 2011

(65) Prior Publication Data

US 2012/0097965 A1 Apr. 26, 2012

(30) Foreign Application Priority Data

Oct. 22, 2010 (KR) ........................ 10-2010-0103498

(51) Int. Cl.
*H01L 29/786* (2006.01)
*H01L 27/12* (2006.01)

(52) U.S. Cl.
CPC ...... *H01L 29/78621* (2013.01); *H01L 27/1285* (2013.01); *H01L 29/78696* (2013.01)

(58) Field of Classification Search
CPC .............. H01L 27/1285; H01L 29/78696; H01L 29/78621
IPC .................. H01L 27/1285, 29/78696, 29/78621
See application file for complete search history.

(56) References Cited

U.S. PATENT DOCUMENTS

| 5,395,772 | A  | * | 3/1995  | Miyazawa et al. | 438/163 |
| 6,040,223 | A  | * | 3/2000  | Liu et al.      | 438/303 |
| 2002/0067459 | A1 | * | 6/2002  | Sugano       | 349/187 |
| 2004/0189615 | A1 | * | 9/2004  | Osame et al. | 345/173 |
| 2004/0256693 | A1 | * | 12/2004 | Sato et al.  | 257/510 |
| 2005/0218932 | A1 | * | 10/2005 | Lim          | 326/81  |
| 2006/0170664 | A1 | * | 8/2006  | Morita et al. | 345/204 |
| 2007/0170526 | A1 | * | 7/2007  | Satou        | 257/408 |
| 2008/0301599 | A1 | * | 12/2008 | Moroz et al. | 716/5   |

FOREIGN PATENT DOCUMENTS

JP  2009-152224      7/2009
KR  10-2000-0060685 A  10/2000

* cited by examiner

*Primary Examiner* — Hrayr A Sayadian
(74) *Attorney, Agent, or Firm* — Christie, Parker & Hale, LLP

(57) ABSTRACT

In a thin film transistor and a display device provided with the same, a thin film transistor according to an exemplary embodiment includes: a semiconductor layer including a channel region, a source region, a drain region, a light-doped source region, and a light-doped drain region; a gate electrode overlapping the channel region; a source electrode contacting the source region; and a drain electrode contacting the drain region. The channel region includes a main channel portion, a source channel portion, and a drain channel portion, and the source channel portion and the drain channel portion are extended from the main channel portion and separated from each other. The light-doped source region is disposed between the source channel portion and the source region and the light-doped drain region is disposed between the drain channel portion and the drain region.

10 Claims, 5 Drawing Sheets

THIN FILM TRANSISTOR AND DISPLAY DEVICE USING THE SAME

CROSS-REFERENCE TO RELATED APPLICATION

This application claims priority to and the benefit of Korean Patent Application No. 10-2010-0103498, filed in the Korean Intellectual Property Office on Oct. 22, 2010, the entire content of which is incorporated herein by reference.

BACKGROUND

1. Field

The following description relates generally to a thin film transistor and a display device having the same. More particularly, the described technology relates generally to a thin film transistor that can suppress occurrence of a failure due to a crystallization protrusion formed in a semiconductor layer, and a display device having the same.

2. Description of Related Art

Most flat panel display devices, such as an organic light emitting diode (OLED) display, a liquid crystal display (LCD), and the like, include a thin film transistor. Particularly, a low temperature polycrystalline silicon thin film transistor (LTPS TFT) having good carrier mobility can be applicable to a high speed operational circuit and can be used for a CMOS circuit so that the LPTS TFT has been commonly used.

The LTPS TFT includes a polycrystalline silicon film that is formed by crystallizing an amorphous silicon film. A method for crystallizing the amorphous silicon film includes a solid phase crystallization method, an excimer laser crystallization method, and a crystallization method using a metal catalyst.

Among various crystallization methods, a crystallization method using a laser beam has been widely used because it enables low temperature process so that a thermal effect on a substrate is relatively low and enables making of a polycrystalline silicon film having a relatively excellent carrier mobility as high as over 100 cm2/Vs.

However, the crystallization method using a laser beam has a problem in that a crystallization protrusion is formed at the surface of a polycrystalline silicon film crystallized through this method. The crystallization protrusion may deteriorate uniformity of a thin film transistor, that is, the crystallization protrusion has negative influences on the thin film transistor.

The above information disclosed in this Background section is only for enhancement of understanding of the background of the described technology and therefore it may contain information that does not form the prior art that is already known in this country to a person of ordinary skill in the art.

SUMMARY

An aspect of an embodiment of the present invention is directed toward a thin film transistor that can suppress an occurrence of failure due to a crystallization protrusion formed in a semiconductor layer.

An aspect of an embodiment of the present invention is directed toward a display device provided with the thin film transistor.

A thin film transistor according to an exemplary embodiment includes: a semiconductor layer including a channel region, a source region, a drain region, a light-doped source region, and a light-doped drain region; a gate electrode overlapping the channel region; a source electrode contacting the source region; and a drain electrode contacting the drain region. The channel region includes a main channel portion, a source channel portion, and a drain channel portion, and the source channel portion and the drain channel portion are extended from the main channel portion and separated from each other. The light-doped source region is disposed between the source channel portion and the source region and the light-doped drain region is disposed between the drain channel portion and the drain region.

The semiconductor layer may be a patterned polycrystalline silicon film having a plurality of crystallization protrusions arranged along a crystallization protrusion line.

The polycrystalline silicon film may be formed by irradiating laser beams to an amorphous silicon layer.

The crystallization protrusions may remain in the semiconductor layer.

The crystallization protrusion line may be formed along a direction that crosses long sides of the light-doped source region and the light-doped drain region.

A direction in which the source channel portion and the drain channel portion are extended from the main channel portion may be angled with a length direction of the crystallization protrusion line by an angle at 0 or 45 degrees or between 0 and 45 degrees.

The channel region of the semiconductor may be bent two times.

The source channel portion and the drain channel portion may have a length direction that is different from that of the main channel portion.

The thin film transistor may further include a gate insulating layer disposed between the semiconductor layer and the gate electrode and an interlayer insulating layer disposed between the gate electrode and the source electrode, and between the gate electrode and the drain electrode. The source electrode and the drain electrode may respectively contact the source region and the drain region through the interlayer insulating layer and the gate insulating layer.

Further, according to the exemplary embodiment, the display device includes the thin film transistor and an organic light emitting element connected with the thin film transistor.

According to another exemplary embodiment, a display device includes the thin film transistor, a pixel electrode connected with the thin film transistor, and a liquid crystal layer formed on the pixel electrode.

According to the exemplary embodiments, an occurrence of failure due to a crystallization protrusion formed in a semiconductor layer of a thin film transistor can be suppressed.

DETAILED DESCRIPTION OF THE EMBODIMENTS

Figure 1:
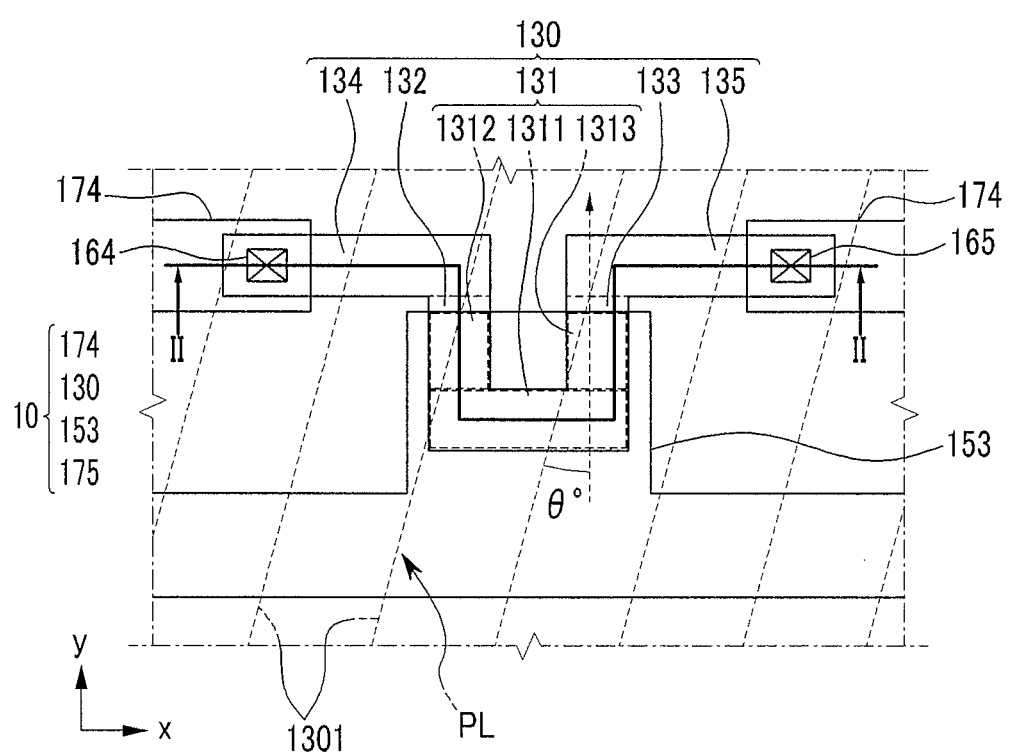
FIG. 1 is a top plan view of a thin film transistor according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Constituent elements having the same structures throughout the embodiments are denoted by the same reference numerals and are described in a first exemplary embodiment.

Furthermore, as the size and thickness of the respective structural components shown in the drawings are arbitrarily illustrated for explanatory convenience, the present invention is not necessarily limited to the illustrated. In the drawings, for better understanding and ease of description, the thickness of layers, films, panels, regions, etc., are exaggerated for clarity. It will be understood that when an element such as a layer, film, region, or substrate is referred to as being "on" another element, it can be directly on the other element or intervening elements may also be present.

Hereafter, a thin film transistor 10 according to the first exemplary embodiment will be described with reference to FIG. 1 and FIG. 2.

A substrate 111 is formed with a transparent insulating substrate made of glass, quartz, ceramic, plastic, or the like. However, the present exemplary embodiment is not limited thereto, and substrate 111 may be formed with a metallic substrate made of stainless steel. In addition, when the substrate 111 is made of plastic, the substrate 111 may be a flexible substrate.

A buffer layer 120 is formed on the substrate 111. The buffer layer 120 is formed with a single layer or a multi-layer including at least one of insulating layers such as a silicon oxide layer or a silicon nitride layer using a chemical vapor deposition method or a physical vapor deposition method.

The buffer layer 120 prevents (or blocks) dispersion of moisture or impurities generated from the substrate 111 or controls the heat transmission speed for crystallization of an amorphous silicon layer.

A semiconductor layer 130 is formed on the buffer layer 120. The semiconductor layer 130 is formed by patterning a polycrystalline silicon film 1300 (shown in FIG. 3) crystallized through a crystallization method using lasers. The polycrystalline silicon film 1300 is formed by crystallizing an amorphous silicon layer formed on the buffer layer 120 using the laser crystallization method.

Figure 3:
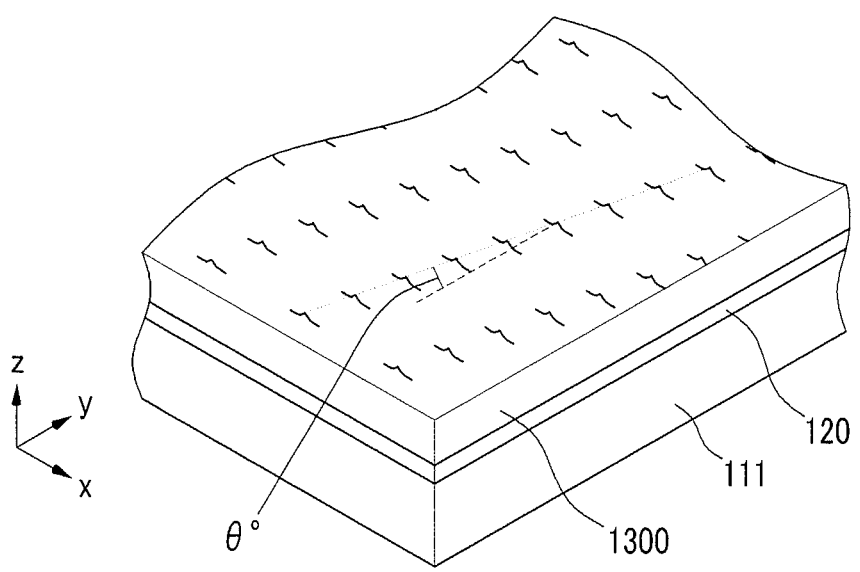
FIG. 3 is a perspective view of a polycrystalline silicon film used in manufacturing of a semiconductor layer of FIG. 2.

The polycrystalline silicon film 1300, as shown in FIG. 3, includes a plurality of crystallization protrusions 1301 arranged along a crystallization protrusion line PL. The crystallization protrusion 1301 is formed at a grain boundary between crystals, and the crystallization protrusion line PL is formed along a direction that lasers are irradiated for crystallization. Further, crystallization protrusions 1301 remain in the semiconductor 130 formed by patterning the polycrystalline silicon film 1300.

In addition, the semiconductor layer 130 includes a channel region 131, a source region 134, a drain region 135, a light-doped source region 132, and a light-doped drain region 133.

The channel region 131 is divided into a main channel portion 1311, a source channel portion 1312, and a drain channel portion 1313. Here, the source channel portion 1312 and the drain channel portion 1313 are extended along the same direction (i.e., y-axis direction) from the main channel portion 1311 and separated from each other. That is, the channel region 131 is bent two times, and both ends of the channel region 131 face toward the same direction (i.e., y-axis direction). In this case, the source channel portion 1312 and the drain channel portion 1313 have a length direction that is different from that of the main channel portion 1311. That is, the source channel portion 1312 and the drain channel portion 1313 extend in the y-axis direction, and the main channel portion 1311 extends in the x-axis direction.

The light-doped source region 132 is disposed between the source channel portion 1312 and the source region 134, and the light-doped drain region 133 is disposed between the drain channel portion 1313 and the drain region 135.

The light-doped source region 132 and the light-doped drain region 133 are respectively disposed between the channel region 131 and the source region 134, and the channel region and the drain region 135 to clearly separate the channel region 131, the source region 134, and the drain region 135. Thus, hot carriers are dispersed, and a leakage current or a punch through is prevented (or blocked) from occurring such that an off current Ioff can be controlled. However, as the lengths of the light-doped regions 132 and 133 are increased, the off current Ioff can be easily controlled but resistance factors are increased so that the driving characteristic of the thin film transistor 10 may be deteriorated. In the present exemplary embodiment, the light-doped source region 132 and the light-doped drain region 133 have suitable lengths in the art.

The light-doped source region 132 and the light-doped drain region 133 are n-doped, the channel region 131 is not doped with impurities, and the source region 134 and the drain region 135 are n+ doped. In the case, an ion material used for doping is an N-type impurity such as phosphor (P), and usually $PH_3$ is used.

Long sides of the light-doped source region 132 and the light-doped drain region 133 are formed in a direction that crosses the crystallization protrusion line PL. In addition, a direction (i.e., y-axis direction) in which the source channel portion 1312 and the drain channel portion 1313 are extended from the main channel 1311 of the channel region 131 may be angled θ with a length direction of the crystallization protrusion line PL at 0 or 45 degrees or between 0 and 45 degrees. Here, the direction in which the source channel portion 1312 and the drain channel portion 1313 are extended from the main channel portion 1311 of the channel region 131 is the same as the length direction (y-axis) of the light-doped source region 132 and the light-doped drain region 133.

With such a configuration, generation of a failure due to the crystallization protrusion 1301 formed in the semiconductor layer 130 can be suppressed.

In further detail and in one embodiment, when the angle θ formed by the extended direction in which the source channel portion 1312 and the drain channel portion 1313 and length direction of the light-doped source region 132 and light-doped drain region 133 is greater than 45 degrees, the source channel portion 1312 and the drain channel portion 1313 are damaged by the crystallization protrusion 1301. Thus, a current is leaked to the thin film transistor 10 so that an image displayed on a display device using such a thin film transistor 10 may be stained.

Meanwhile, in one embodiment, when the angle θ formed by the direction in which the source channel portion 1312 and the drain channel portion 1313 and length direction of the light-doped source region 132 and light-doped drain region 133 is in the range between 0 to 45 degrees, damage to the light-doped source region 132 and the light-doped drain region 133 due to the crystallization protrusion 1301 can be reduced.

For example, the angle θ formed by the length direction (y-axis) of the light-doped source region 132 and the light-doped drain region 133 and the length direction of the crystallization protrusion line PL is included in a range between 4 to 8 degrees, an image displayed on the display device is not stained.

In addition, when long sides of the light-doped source region 132 and the light-doped drain region 133 are parallel with each other, the influence due to the crystallization protrusion 1301 becomes non-uniform.

Further, since the channel region 131 is bent rather than being straight lined, the influence of the crystallization protrusion 1301 on the channel region 131 may be more uniform and minimized. Thus, reduction of the on-current Ion of the thin film transistor 10 can be suppressed, and uniformity can be improved.

This is because the length direction of the main channel portion 1311 of the channel region 131 is different from that of the source channel portion 1312 and drain channel portion 1313 so that the influence of the crystallization protrusion 1301 formed along the crystallization protrusion line PL can be more uniformly formed and the number of crystallization protrusions 1301 formed in the channel region 131 per unit may be decreased.

By contrast, when the channel region 131 is formed in the shape of a straight line, the occurrence of stain failure may be suppressed but the on-current Ion of the thin film transistor 10 is decreased even through the long sides of the light-doped source region 132 and the light-doped drain region 133 cross the crystallization protrusion line PL.

A gate insulating layer 140 is formed on the semiconductor layer 130. In the exemplary embodiment, the gate insulating layer 140 is formed on the buffer layer 120 to cover the semiconductor layer 130. The gate insulating layer 140 includes at least one of various suitable insulating materials in the art, such as tetra ethyl ortho silicate (TEOS), silicon nitride (SiNx), silicon oxide (SiO$_2$), etc.

A gate electrode 153 is formed on the gate insulating layer 140. The gate electrode 153 may include molybdenum (Mo), chromium (Cr), aluminum (Al), silver (Ag), titanium (Ti), tantalum (Ta), and/or tungsten (W).

Further, the gate electrode 153 overlaps the channel region 131 of the semiconductor layer 130. The light-doped source region 132 and the light-doped drain region 133 are respectively arranged adjacent to the same edge of the gate electrode 153.

An interlayer insulating layer 160 is formed on the gate electrode 153. That is, the interlayer insulating layer 160 covers the gate electrode 153 on the gate insulating layer 140. Like the gate insulating layer 140, the interlayer insulating layer 160 may be formed with an inorganic layer such as tetra ethyl ortho silicate (TEOS), silicon nitride (SiNx), or silicon oxide (SiOx), or may be formed with an organic layer.

The interlayer insulating layer 160 and the gate insulating layer 140 have a plurality of contact holes 164 and 165 respectively exposing parts of the source region 134 and the drain region 135 of the semiconductor layer 130.

A source electrode 174 and a drain electrode 175 contacting the source region 134 and the drain region 135 of the semiconductor layer 130 respectively through the contact holes 164 and 165 are formed on the interlayer insulating layer 160. The source electrode 174 and the drain electrode 175 are separated from each other.

In addition, like the gate electrode 153, the source electrode 174 and the drain electrode 175 may include molybdenum (Mo), chromium (Cr), aluminum (Al), silver (Ag), titanium (Ti), tantalum (Ta), and/or tungsten (W).

With such a configuration, the thin film transistor 10 according to the exemplary embodiment can reduce or minimize an occurrence of failure due to the crystallization protrusion 1301 formed in the semiconductor layer 130.

Hereafter, a display device 101 provided with the thin film transistor 10 of FIG. 1 will be described with reference to FIG. 4.

Figure 4:
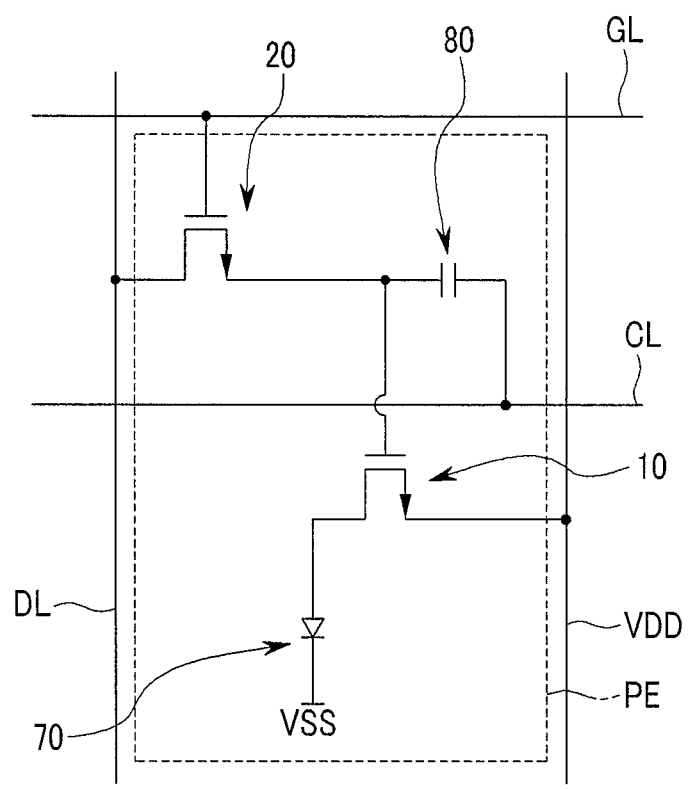
FIG. 4 is an equivalent circuit diagram of a display device provided with the thin film transistor of FIG. 1.

The display device 101 shown in FIG. 4 is an organic light emitting diode (OLED) display having a structure in which one pixel PE has a 2Tr-1 Cap structure with an organic light emitting diode 70, two thin film transistors (TFTs) 10 and 20, and a capacitor 80. However, the display device 101 is not limited to the above-described structure. Thus, the display device 101 may be variously suitably structured such that three or more thin film transistors and two or more capacitors are provided at one pixel. Further, the display device 101 may further include additional wires. As described, at least one of the additionally formed thin film transistors and the capacitor may be formed as a compensation circuit.

The compensation circuit improves uniformity of an organic light emitting element 70 formed in each pixel area PE to suppress occurrence of image deviation. In general, the compensation circuit may include two to eight thin film transistors.

The organic light emitting element 70 includes an anode which is a hole injection electrode, a cathode which is an electron injection electrode, and an organic emission layer formed between the anode and the cathode.

In further detail, the display device 101 may include a first thin film transistor 10 and a second thin film transistor 20 in each pixel area PE. The first thin film transistor 10 and the second thin film transistor 20 respectively include a gate electrode, an active layer, a source electrode, and a drain electrode.

Figure 2:
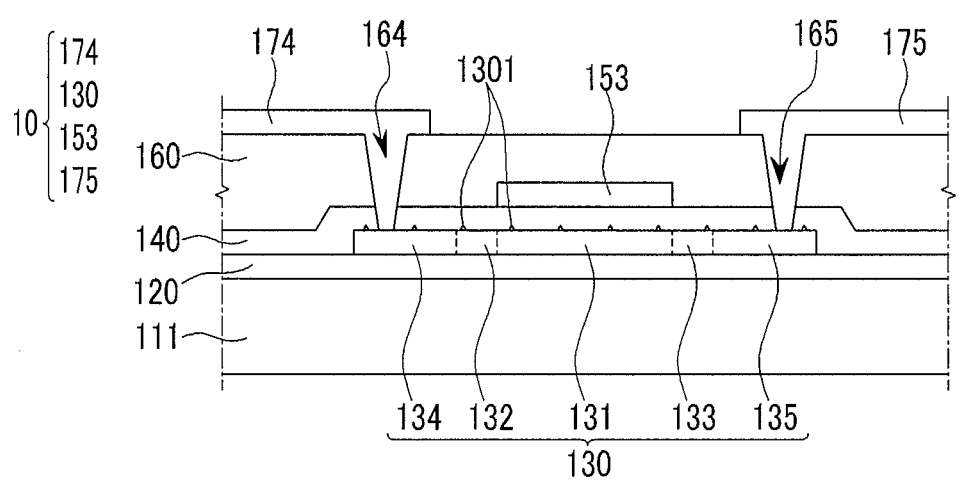
FIG. 2 is a cross-sectional view of FIG. 1, taken along the line II-II.

FIG. 2 illustrates that the gate line GL, the data line DL, and the common power line VDD are shown together with the capacitor line CL, but it is not restrictive. Thus, the capacitor line CL may be omitted as necessary.

A source electrode of the second thin film transistor 20 is connected to the data line DL, and a gate electrode of the second thin film transistor 20 is connected to the gate line GL. In addition, a drain electrode of the second thin film transistor 20 is connected to the capacitor line CL through the capacitor 80. Further, a node is formed between the drain electrode of the second thin film transistor 20 and the capacitor 80, and a gate electrode of the first thin film transistor 10 is connected thereto. The common power line VDD is connected with a drain electrode of the first thin film transistor 10, and the anode of the organic light emitting element 70 is connected to a source electrode of the first thin film transistor 10.

The second thin film transistor 20 is used as a switch to select a pixel area PE for light emission. When the second thin film transistor 20 is instantaneously turned on, the capacitor 80 is charged and the amount of charges in the capacitor 80 is proportional to a potential of a voltage applied from the data line DL. In addition, when a signal that increases a voltage for each frame period is input to the capacitor line CL while the second thin film transistor 20 is being turned off, a gate potential of the first thin film transistor 10 increases along a voltage applied through the capacitor line CL, with reference to the potential charged in the capacitor 80.

In addition, the first thin film transistor 10 is turned on when the gate potential is higher than a threshold voltage. Then, the voltage applied to the common power line VDD is applied to the organic light emitting element 70 through the first thin film transistor 10 such that the organic light emitting element 70 emits light.

Such a configuration of the pixel area PE is not limited to the above description, and it can be variously modified within a range that a person skilled in the art can easily deform and realize.

Hereinafter, another display device 102 provided with the thin film transistor 10 of FIG. 1 will be described with reference to FIG. 5.

Figure 5:
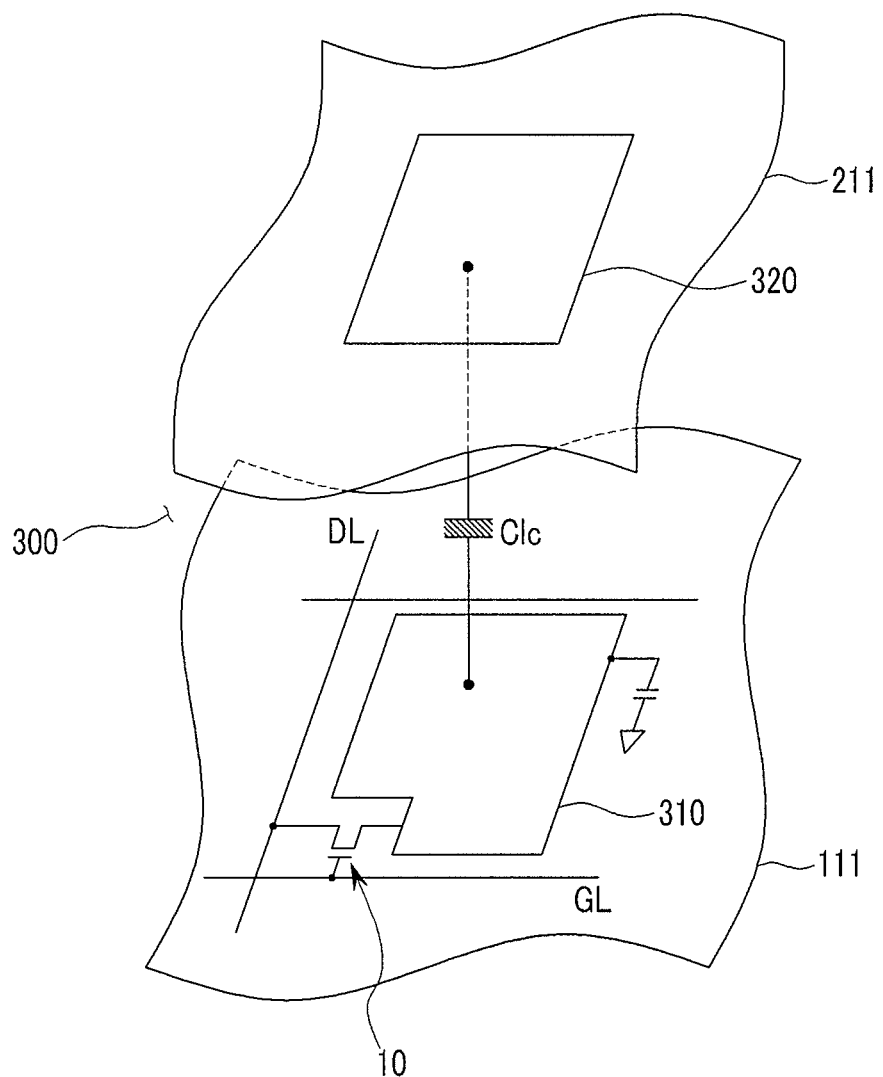
FIG. 5 is an equivalent circuit diagram of another display device provided with the thin film transistor of FIG. 1.

A display device 102 of FIG. 5 includes a liquid crystal layer 300 instead of including an organic light emitting element 70. In further detail, the display device 102 includes a pixel electrode 310 connected with the drain electrode of the film transistor 10, a liquid crystal layer 300 formed on the pixel electrode 310, and a common electrode 320 formed on the liquid crystal layer 300.

The liquid crystal layer 300 may include various suitable liquid crystals in the art.

The display device 102 further includes a substrate 111 and an opposite substrate 211 disposed facing the substrate 111, interposing the liquid crystal layer 300 therebetween. The common electrode 320 is formed on the opposite substrate 211.

Although it is not shown, the display device 102 may further include polarization plates respectively attached to the substrate 111 and the opposite substrate 210.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF CERTAIN SYMBOLS

10: thin film transistor
101, 102: display device
111: substrate
120: buffer layer
130: semiconductor layer
131: channel region
132: light-doped source region
133: light-doped drain region
134: source region
135: drain region
140: gate insulating layer
153: gate electrode
160: interlayer insulating layer
174: source electrode
175: drain electrode
1301: crystallization protrusion
PL: crystallization protrusion line

What is claimed is:

1. A thin film transistor comprising:
a buffer layer;
a semiconductor layer on the buffer layer and comprising a channel region, a source region, a drain region, a light-doped source region, and a light-doped drain region, each having a same thickness and on a same plane;
a gate electrode overlapping the channel region;
a source electrode contacting the source region; and
a drain electrode contacting the drain region,
wherein:
the channel region comprises a main channel portion, a source channel portion, and a drain channel portion,
the source channel portion and the drain channel portion are extended from the main channel portion and separated from each other,
the light-doped source region is disposed between the source channel portion and the source region,
the light-doped drain region is disposed between the drain channel portion and the drain region,
the source region and the drain region are lined up along a first direction,
the main channel portion is parallel to but laterally offset from the lined up source region and drain region, and
the source channel portion and the drain channel portion are perpendicular to the lined up source region and drain region.

2. The thin film transistor of claim 1, wherein the semiconductor layer is a patterned polycrystalline silicon film having a plurality of crystallization protrusions arranged along a crystallization protrusion line.

3. The thin film transistor of claim 2, wherein the polycrystalline silicon film is formed by irradiating laser beams to an amorphous silicon layer.

4. The thin film transistor of claim 2, wherein the crystallization protrusions remain in the semiconductor layer.

5. The thin film transistor of claim 2, wherein the crystallization protrusion line is formed along a direction crossing long sides of the light-doped source region and the light-doped drain region.

6. The thin film transistor of claim 2, wherein a direction in which the source channel portion and the drain channel portion are extended from the main channel portion is angled with a length direction of the crystallization protrusion line by an angle at 0 or 45 degrees or between 0 and 45 degrees.

7. The thin film transistor of claim 1, wherein the channel region of the semiconductor is bent two times.

8. The thin film transistor of claim 1, further comprising:
a gate insulating layer disposed between the semiconductor layer and the gate electrode; and
an interlayer insulating layer disposed between the gate electrode and the source electrode, and between the gate electrode and the drain electrode,
wherein the source electrode and the drain electrode respectively contact the source region and the drain region through the interlayer insulating layer and the gate insulating layer.

9. A display device comprising:
the thin film transistor of claim 1; and
an organic light emitting element connected to the thin film transistor.

10. A display device comprising:
the thin film transistor of claim 1;
a pixel electrode connected with the thin film transistor; and
a liquid crystal layer formed on the pixel electrode.

* * * * *